(12) United States Patent
Miyake (10) Patent No.: US 6,825,481 B2
(45) Date of Patent: Nov. 30, 2004

(54) EXPOSURE APPARATUS, CONTROL METHOD THEREOF, AND DEVICE MANUFACTURING METHOD USING THE SAME

(75) Inventor: Akira Miyake, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/351,416

(22) Filed: Jan. 27, 2003

(65) Prior Publication Data

US 2003/0142410 A1 Jul. 31, 2003

(30) Foreign Application Priority Data

Jan. 29, 2002 (JP) ........................................ 2002-020213

(51) Int. Cl.[7] ............................................ H01L 21/27
(52) U.S. Cl. ........................ 250/492.2; 378/34; 355/68
(58) Field of Search ........................ 250/492.2; 378/34; 355/68, 66

(56) References Cited

U.S. PATENT DOCUMENTS

| | | | |
|---|---|---|---|
| 5,222,112 A | 6/1993 | Terasawa et al. | 378/34 |
| 5,394,451 A | 2/1995 | Miyake et al. | 378/34 |
| 5,606,586 A | 2/1997 | Amemiya et al. | 378/34 |
| 5,896,438 A | 4/1999 | Miyake et al. | 378/34 |
| 6,038,279 A | 3/2000 | Miyake et al. | 378/34 |
| 6,054,713 A | 4/2000 | Miyake et al. | 250/492.24 |
| 6,256,087 B1 | 7/2001 | Bader | 355/67 |
| 6,400,444 B2 * | 6/2002 | Suzuki | 355/68 |
| 6,504,896 B2 | 1/2003 | Miyake et al. | 378/34 |
| 6,594,334 B1 * | 7/2003 | Ota | 378/34 |
| 6,628,371 B1 * | 9/2003 | Ishikawa | 250/492.2 |

FOREIGN PATENT DOCUMENTS

| | | |
|---|---|---|
| EP | 0 283 149 A2 | 2/1988 |
| EP | 0 867 772 A2 | 3/1998 |
| EP | 0 987 601 | 3/2000 |
| JP | 63-72116 | 4/1988 |
| JP | 2000-100685 | 4/2000 |

OTHER PUBLICATIONS

European Search Report dated Nov. 27, 2003, issued in corresponding European patent appln. No. 03 25 0552, forwarded in a Communication dated Dec. 10, 2003.

* cited by examiner

Primary Examiner—Jack I. Berman
(74) Attorney, Agent, or Firm—Fitzpatrick, Cella, Harper & Scinto (57) ABSTRACT

EUV exposure apparatus for transferring a pattern on a reticle to a wafer, includes an illumination optical system having a plurality of illumination system mirrors for directing EUV light to the reticle, and a projection optical system having a plurality of projection system mirrors for directing reflection light from the reticle to the wafer. In the illumination optical system, a reflection-type optical integrator is arranged to form a plurality of light source images with the light from the light source. The optical integrator has a pinhole to branch a part of the EUV light to an EUV-light intensity detector. A controller controls the amount of exposure based on the intensity of EUV light detected by the EUV-light intensity detector. In this manner, precision in measuring the intensity of exposure light is improved, and compensation control of the amount of exposure is appropriately performed.

19 Claims, 10 Drawing Sheets

EXPOSURE APPARATUS, CONTROL METHOD THEREOF, AND DEVICE MANUFACTURING METHOD USING THE SAME

FIELD OF THE INVENTION

The present invention relates to an exposure apparatus capable of transferring a microcircuit pattern, and control method thereof.

BACKGROUND OF THE INVENTION

As a conventional exposure (lithography) method for manufacturing micro semiconductor devices, such as semiconductor memory or logical circuits or the like, demagnifying projection exposure using ultraviolet light has been employed.

The minimum size transferable in the demagnifying projection exposure is proportional to a wavelength of light used in the transfer, and is inversely proportional to the numerical aperture of a projection optical system. Therefore, in order to transfer a microcircuit pattern, it is necessary to pursue a shorter wavelength of light used in the transfer. For this reason, wavelengths of ultraviolet light used are becoming shorter, e.g., mercury lamp i-ray (wavelength of 365 nm), KrE excimer laser (wavelength of 248 nm), ArF excimer laser (wavelength of 193 nm) and so forth.

However, because semiconductor devices are rapidly miniaturizing, the lithography using ultraviolet light has begun to reach its limits. Therefore, in order to perform efficient exposure of a very small microcircuit pattern, which is smaller than 0.1 μm, a demagnifying projection exposure apparatus using extreme-ultraviolet light (EUV light), having even shorter wavelength (about 10 to 15 nm) than ultraviolet light, has been developed.

In such EUV-light area, since EUV light is very largely absorbed by substances, a lens optical system employing refraction of light, such as that used in visible light or ultraviolet light, is not practical. Instead, the exposure apparatus using EUV light adopts a reflection optical system. In this case, for a reticle (mask) also, a reflection-type reticle (reflection-type mask), where a pattern subjected to transfer is formed on a mirror with an absorptive member, is employed.

As a reflection-type optical device which constitutes the exposure apparatus using EUV light, there are multilayer mirrors and grazing incidence total reflection mirrors. In the EUV-light area, since the real part of refractive index is slightly smaller than 1, total reflection takes place if EUV light is obliquely incident very closely to the surface. Normally, with a grazing incident angle of several degrees or less from the surface, a reflectivity higher than several tens of % can be achieved. However, because of the low flexibility in terms of optical designing, it is difficult to apply total reflection mirrors to the projection optical system.

For an EUV-light mirror used at an incident angle close to normal incidence, a multilayer mirror, where two types of substances having different optical constants are alternately layered, is used. In the multilayer mirror, molybdenum and silicon are alternately layered on the surface of a glass substrate polished into a fine plane shape. The thickness of the layer is, for instance, 2 nm for a molybdenum layer, and about 5 nm for a silicon layer, and the number of layers laminated is about 40 layers in pairs. The thickness of the layers including the two types of substances is called a film period. In the foregoing example, the film period is 2 nm+5 nm=7 nm.

When EUV light is incident on such multilayer mirrors, EUV light having a specific wavelength is reflected. Assuming an incident angle is θ; the wavelength of the EUV light, λ; and the film period, d; only the EUV light having a narrow bandwidth, whose center λ approximately satisfies Bragg's equation $2 \times d \times \cos\theta = \lambda$, is efficiently reflected. The bandwidth herein is about 0.6 to 1 nm.

The reflectivity of the EUV light reflected is about 0.7 at the maximum. EUV light that is not reflected is absorbed in the multilayer film or the substrate, and most part of the energy thereof turns into heat.

Since the multilayer mirrors used in the EUV area have a large light loss compared to mirrors used in visible light, it is necessary to minimize the number of mirrors. To ensure a wide exposure area with the small number of mirrors, a method (scan exposure) of transferring a wide area by simultaneously scanning a reticle and a wafer only with the use of a thin arc-shaped area (ring field) that is away from an optical axis by a fixed distance, may be considered.

In the case of employing the above-described EUV light as exposure light, a laser plasma light source or an electric discharge plasma light source is used. However in such EUV exposure apparatus, there are following problems.

A laser plasma light source used as an EUV light source is realized by irradiating a highly intense pulse laser beam to a target material for generating high-temperature plasma, and employing EUV light emitted therefrom, having a wavelength of, e.g., about 13 nm. The intensity of EUV light emitted from the laser plasma light source fluctuates depending on a temperature of the target. Particularly in the method of achieving a high-density target by increasing a gas density with adiabatic expansion of gas or clustering the gas, a slight change in the temperature of the emitted gas or nozzles greatly changes the target density at the time of irradiating excitation laser, and along with that, largely changes the intensity of EUV light emitted.

If the intensity of EUV light emitted from the light source changes, the amount of EUV light irradiated to a wafer fluctuates, causing variations in the size of a microcircuit pattern subjected to transfer or disabling the transfer of a microcircuit pattern.

Similarly, an intensity of EUV light emitted from the electric discharge plasma light source fluctuates depending on a temperature of electrodes or gas. The electric discharge plasma light source is realized by applying a pulse voltage to electrodes in gas for generating high-temperature plasma, and employing EUV light emitted therefrom, having a wavelength of, e.g., about 13 nm. In the electric discharge plasma light source also, nozzles of a gas supplying device or electrodes are heated by electromagnetic waves or particles emitted from the plasma, and electrodes are heated by Joule heat inside the electrodes. For these reasons, the intensity of EUV light emitted from the light source changes, and along with that, the amount of EUV light irradiated to a wafer fluctuates, causing variations in the size of a microcircuit pattern subjected to transfer or disabling the transfer of a microcircuit pattern.

Furthermore, the high-temperature plasma generated in the laser plasma light source emits high-speed gas molecules and charged particles. There is a case in which a part of a target material supplying device is sputtered by high-speed particles of the plasma (sputtering phenomenon), causing atomic elements on the surface to fly. These are called debris. If the debris is irradiated to an initial-stage mirror of the illumination system which illuminates a reticle with light from the light source, the multilayer film of the mirror is damaged. The mechanism is as follows:

the multilayer structure is destroyed by particle energy;
the target material and material of the target supplying device are deposited on the multilayer film, and become an EUV-light absorbing layer;
the heated multilayer film causes recrystallization of substances constituting the film, and counter diffusion causes the film structure to change.

Similarly, the plasma generated in the electric discharge plasma light source also emits high-speed gas molecules and charged particles. There is a case in which an electrode material or a part of an insulation material holding the electrode is sputtered by high-speed particles of the plasma, causing atomic elements on the surface to fly. If the debris is irradiated to an initial-stage mirror of the illumination system, the multilayer film of the mirror is damaged.

Because of these phenomena, the reflectivity of the multilayer mirror gradually decreases along with operation of the EUV light source. Therefore, the intensity of EUV light illuminating a reticle gradually declines. Accordingly, the amount of EUV light irradiated to a wafer fluctuates, causing variations in the size of a microcircuit pattern subjected to transfer or disabling the transfer of a microcircuit pattern.

As means for solving the above-described problems of fluctuation in the illumination intensity, for instance, Japanese Patent Application Laid-Open No. 2000-100685 discloses an exposure apparatus for transferring a pattern of a mask onto a photoreceptive substrate. The exposure apparatus comprises an X-ray light source that generates X rays and an illumination system that guides X rays from the X-ray light source to the mask, and the illumination system has a plurality of reflection mirrors. With respect to a reflection surface of at least one of the plurality of reflection mirrors, a detection device is arranged to detect an electrical characteristic that accompanies photoelectric effects of the X-ray irradiation. The amount of exposure is adjusted in accordance with a detection result of the detection device, and fluctuation in the illumination intensity of the exposure light is compensated.

In this conventional example, a detector taking advantage of photoelectric effects is arranged on the reflection surface of the reflection mirror. Therefore, the photoelectric surface becomes extremely sensitive to the state of its surface. Only a slight contamination on the surface largely changes the measurement sensitivity, and the measurement precision declines.

Furthermore, in the foregoing conventional method, photons reflected by the mirror do not cause photoelectric effects, but only the absorbed photons cause photoelectric effects. Therefore, in this method, the intensity of light absorbed by the mirror is measured, instead of EUV light reflected by the mirror. From an EUV light source, light having various wavelengths is emitted in addition to the light having a wavelength used for the exposure. The light having various wavelengths is reflected at a certain ratio on the multilayer reflection mirror, and passes through the internal portion of the illumination optical system. Therefore, in the method adopting the detector employing photoelectric effects, which is arranged on the reflection surface of the reflection mirror, the detection result is influenced by the intensity of light emitted from the EUV light source, which has wavelengths that do not contribute to the exposure; thus measurement precision is deteriorated.

The following approach may be considered as means to solve the problem of the illuminance fluctuation. That is, the approach divides a part of the luminous flux of the exposure in the wave front in a light path of the illumination optical system, detects the part of the luminous flux, and adjusts the exposure light amount and compensates the exposure illuminance based on the detection result. However, there is a problem of causing unevenness illuminance on the reticle if the division in wavefront is performed at neighborhood of the reticle.

SUMMARY OF THE INVENTION

The present invention is proposed in view of the above-described problems, and has as its exemplificative object to improve precision in measuring an intensity of exposure light and appropriately perform compensation control of the amount of exposure.

Furthermore, another exemplificative object of the present invention is to improve precision in measuring an intensity of exposure light, prevent variations in the size of a microcircuit pattern or reduction in resolution caused by fluctuations of a light-emitting intensity of a light source, and realize exposure control which enables stable transferring of a microcircuit pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<First Embodiment>

In an EUV exposure apparatus according to the first embodiment, an intensity of EUV light is measured in order to control the amount of exposure and determine mirror damage. This measurement, which will be described later, is realized by partially branching a part of illumination light at the position of a reflection-type integrator of an illumination optical system and detecting the light by an EUV-light intensity detector.

Figure 1:
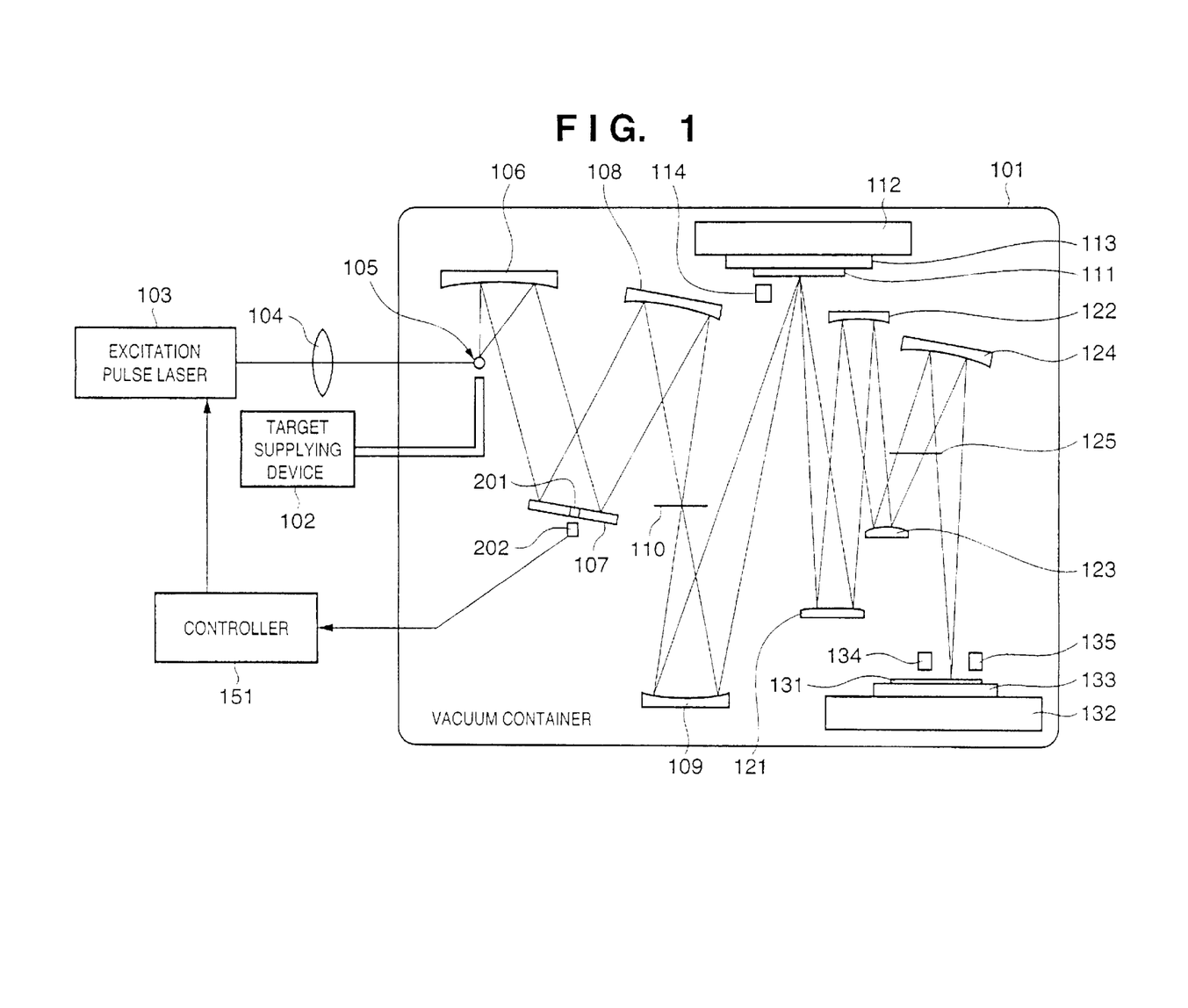
FIG. 1 is a view showing a brief construction of an EUV-light exposure apparatus according to the first embodiment.

FIG. 1 is a view showing a brief construction of an EUV-light exposure apparatus according to the first embodiment. As shown in FIG. 1, the EUV exposure apparatus is constructed with an EUV light source, illumination optical system, reflection-type reticle, projection optical system, reticle stage, wafer stage, alignment optical system, and vacuum system.

For the EUV light source of the first embodiment, a laser plasma light source is employed. This is realized by irradiating a highly intense pulse laser beam to a target material supplied in a vacuum chamber 101 to generate high-temperature plasma 105, and employing EUV light emitted therefrom, having a wavelength of, e.g., about 13 nm. For the target material, a thin-film metal, noble gas, liquid droplet or the like is used. The target material is supplied to the vacuum chamber 101 by a target supplying device 102 comprising means such as gas jet or the like. The pulse laser beam is outputted by excitation pulse laser 103, and irradiated to the target material through a light-focusing lens 104. To increase an average intensity of EUV light emitted, it is better to set recurrence frequencies of the pulse laser high. The excitation pulse laser 103 is normally operated at recurrence frequencies of several kHz.

Needless to say, an electric discharge plasma light source can be employed as an EUV light source. The electric discharge plasma light source is realized by emitting gas on the periphery of electrodes placed in a vacuum chamber, applying a pulse voltage to the electrodes to cause electrical discharges and generate high-temperature plasma, and employing EUV light emitted therefrom, having a wavelength of, e.g., 13 nm. To increase an average intensity of EUV light emitted, it is better to set recurrence frequencies of the electrical discharges high; normally operated at recurrence frequencies of several kHz.

The illumination optical system is constructed with a plurality of multilayer films or grazing incidence mirrors, and an optical integrator. The illumination optical system guides EUV light, which is emitted from the plasma 105, to a reticle 111 by the illumination system first mirror 106, optical integrator 107, illumination system second mirror 108, and illumination system third mirror 109.

The initial-stage light-focusing mirror (illumination system first mirror) 106 serves to collect EUV light that is virtually isotropic-emitted from the laser plasma 105. The optical integrator 107 serves to uniformly illuminate the reticle at a predetermined numerical aperture. In the illumination optical system, a field-limiting aperture 110 is provided at a conjugate position of the reticle so as to limit the illumination area to an arc shape on the reticle surface.

Figure 8:
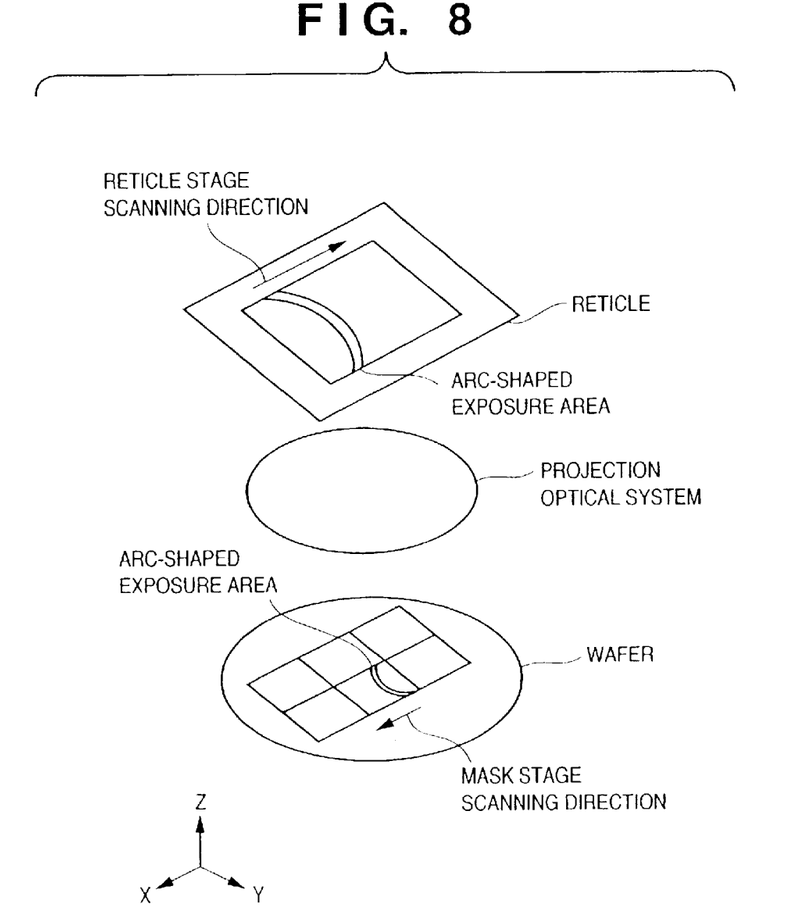
FIG. 8 is an explanatory view of an arc-shaped exposure area.

The reticle is irradiated in this arc-shaped exposure area, and reflection light thereof is irradiated to the wafer through a projection optical system. Since multilayer mirrors have a large light loss compared to mirrors used in visible light, it is necessary to minimize the number of mirrors. To ensure a wide exposure area with the small number of mirrors, a method (scan exposure) of transferring a wide area by simultaneously scanning the reticle and wafer only with the use of a thin arc-shaped area (ring field) that is away from an optical axis by a fixed distance, is used (see FIG. 8).

A plurality of mirrors are used in the projection optical system as well. In FIG. 1, the projection system first to fourth mirrors (121 to 124) guide the reflection light from the reticle 111 to a wafer 131 mounted on a wafer chuck 133. Although the smaller the number of mirrors, the higher the utilization efficiency of EUV light, aberration correction becomes difficult. The number of mirrors necessary for aberration correction is 4 to 6. The shape of the reflection surface of the mirror is spherical or non-spherical having a convex or concave surface. The numerical aperture NA is about 0.1 to 0.3. Note that reference numeral 125 denotes a NA-limiting aperture, which limits luminous flux to regulate the numerical aperture of the projection optical system.

Each of the mirrors is made by grinding and polishing a substrate, which consists of materials such as glass having a low coefficient of expansion or silicon carbide or the like, having a high rigidity and hardness and having a low coefficient of thermal expansion, to form a predetermined reflection surface, and then multilayer films, such as molybdenum and silicon, are deposited on the reflection surface. In a case where an incident angle is not constant depending on locations of the mirror surface, the wavelength of EUV light whose reflectivity becomes high depending on locations is deviated on the multilayer film having a constant film period, as apparent from the aforementioned Bragg's equation. Therefore, it is necessary to provide a film period distribution in such a manner that EUV light having the same wavelength is efficiently reflected by the mirror surface.

The reticle stage 112 and wafer stage 132 have a mechanism for synchronously scanning at a speed ratio that is equal to a demagnification ratio. Herein, it is defined that the scanning direction on the reticle or wafer surface is X, the direction perpendicular to the X direction is Y, and the direction perpendicular to the reticle or wafer surface is Z.

The reticle 111 is supported by a reticle chuck 113 on the reticle stage 112. The reticle stage 112 has a mechanism for driving at high speed in the X direction. Furthermore, the reticle stage 112 has a precise positioning mechanism with respect to each of the X, Y, and Z directions as well as the rotation directions of each of the axes, to perform positioning of the reticle 111. The position and orientation of the reticle stage are measured by a laser interferometer, and based on a result thereof, the position and orientation are controlled.

The wafer 131 is mounted on the wafer stage 132 by the wafer chuck 133. The wafer stage has a mechanism for driving at high speed in the X direction, as similar to the reticle stage. Furthermore, the wafer stage has a precise positioning mechanism with respect to each of the X, Y, and Z directions as well as the rotation directions of each of the axes, to perform positioning of the wafer. The position and orientation of the wafer stage 132 are measured by a laser interferometer, and based on a result thereof, the position and orientation are controlled.

Alignment detection mechanisms 114 and 134 respectively measure a position relation between the position of the reticle 111 and an optical axis of the projection optical system, and the position relation between the position of the wafer 131 and an optical axis of the projection optical system. The position and angle of the reticle stage 112 and wafer stage 132 are set so that the position of a projection image of the reticle 111 matches a predetermined position.

Furthermore, a focus position in the Z direction of the wafer surface is measured by the focus position detection mechanism 135. By controlling the position and angle of the wafer stage 132, the wafer surface is held at an image forming position of the projection optical system at all times of an exposure.

When a single time of scan exposure is completed on the wafer 131, the wafer stage 132 step-moves in the X and Y directions to the next scan-exposure start position, and again the reticle stage 112 and wafer stage 132 are synchronously scanned at a speed ratio that is equal to a demagnification ratio of the projection optical system.

In the foregoing manner, the synchronous scanning of the reticle and wafer is repeated (step and scan) while a demagnified projection image of the reticle is formed on the wafer. As a result, a transfer pattern of the reticle is transferred on the entire surface of the wafer.

EUV light is largely absorbed by gas. For instance, when EUV light having a wavelength of 13 nm propagates 1 m in a space filled with air of 10 Pa, about 50% of the light is absorbed. To prevent absorption by air, it is necessary to keep the pressure of the space where EUV light propagates, at least at $10^{-1}$ Pa or lower, more preferably $10^{-3}$ Pa or lower.

Furthermore, in a case where the space, where the optical device irradiated by EUV light is placed, includes the remnants of molecules having carbons such as hydrocarbons, the carbons gradually attaches to the surface of the optical device as light irradiation is performed. Since the attached carbons absorb EUV light, the reflectivity declines. To prevent the carbon attachment, it is necessary to keep the pressure of the space, where the optical device irradiated by EUV light is placed, at least at $10^{-4}$ Pa or lower, more preferably $10^{-6}$ Pa or lower. For this reason, the light source, optical device such as the illumination system and projection optical system, reticle, and wafer are placed in the vacuum chamber 101, and air evacuation is performed to satisfy the aforementioned degree of vacuum.

The reference numeral 151 in FIG. 1 denotes a controller which controls the amount of exposure in the EUV exposure apparatus based on a detection result of an EUV-light intensity detector 202.

Figure 2:
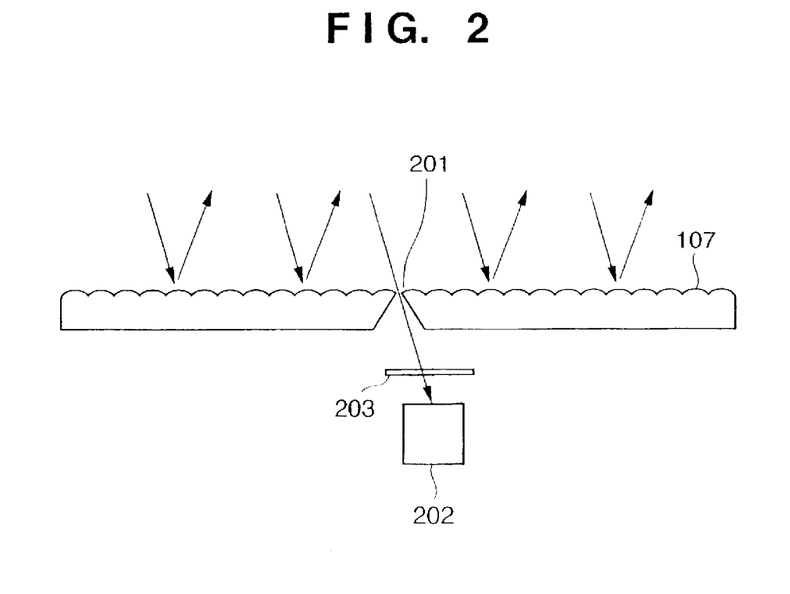
FIG. 2 is an explanatory view showing constructions of a reflection-type optical integrator and its peripherals according to the first embodiment.

FIG. 2 is an explanatory view showing constructions of the reflection-type optical integrator 107 and its peripherals in the above-described configuration. In the optical integrator 107, a large number of very small reflection surfaces, having a predetermined shape, are arranged on a plane or curved surface. When EUV light is incident on the reflection-type optical integrator 107, a large number of secondary light sources are formed in the neighborhood of the reflection-type optical integrator 107. If the reflection-type optical integrator has concave-surface mirrors, the secondary light sources are located on the external portion of the reflection surface of the reflection-type optical integrator. If the reflection type-optical integrator has convex-surface mirrors, the secondary light sources are located on the internal portion of the reflection surface of the reflection-type optical integrator.

EUV light emitted from each of the secondary light sources is collected by the mirrors of the illumination optical system to illuminate the reticle 111. By arranging the concave-surface mirrors so as to become an entrance pupil of the luminous flux of the secondary light source illuminating the reticle 111, Koehler illumination is realized. Therefore, the reflection-type optical integrator is approximately at the entrance pupil position of the luminous flux illuminating the reticle.

According to the first embodiment, a very small pinhole 201 is provided on the reflection-type optical integrator 107. Furthermore, the EUV-light intensity detector 202 is provided opposite to the EUV-light incident side of the optical integrator 107, to detect an intensity of EUV light passing through the pinhole 201.

For the EUV-light intensity detector 202, a photodiode such as silicon, a photomultiplier including phosphors, an electron multiplier tube including an ion chamber and photoelectric surfaces, and so forth are used. To remove visible light detected by the EUV-light intensity detector 202, it is preferable to use a filter 203 formed with a thin-film metal.

Furthermore, a semiconductor diode is known to cause damage, such as lowered sensitivity, when it receives intense EUV light. To avoid such damage, the intensity of EUV light on the photoreceptive surface must be lowered to a predetermined level or less. For this reason also, it is preferable to provide the filter 203 at the front of the EUV-light intensity detector 202. Moreover, to prevent deteriorated precision due to stray light or the like, it is preferable to use a filter material, which relatively highly transmits EUV light having a wavelength whose reflectivity on multilayer films is high, and absorbs light having other wavelengths. Such filter is realized by selecting a material including elements that constitute the light element layer forming the multilayer films of the mirror. For instance, in the case of employing multilayer films of molybdenum and silicon in the mirror, silicon is the light element and molybdenum is the heavy element. Therefore, a filter formed with a material including silicon, e.g., monocrystal silicon, silicon carbide, silicon nitride or the like, is employed. Alternatively, in the case of employing multilayer films of molybdenum and beryllium for the mirror, a filter formed with beryllium is employed.

In the case of employing a filter such as monocrystal silicon, silicon carbide, or silicon nitride or the like, it is preferable that the filter be laminated with the filter formed with a thin-film metal, such as beryllium, for removing visible light as mentioned above.

EUV light incident on a point of the optical integrator sometimes has a predetermined divergence angle. In this case, EUV light that passes through the pinhole 201 diverges at the same angle. If it is so structured that the EUV-light intensity detector 202 is arranged away from the pinhole 201 by a predetermined distance, the EUV-light intensity per unit on the photoreceptive surface of the detector 202 reduces, and the damage such as lowered sensitivity can be prevented. The distance between the detector and pinhole is set so that the size of the area on the detector where EUV light is irradiated becomes as large as possible within the size of the photoreceptive surface of the detector.

By virtue of having the foregoing configuration, an intensity of EUV light can be measured approximately at the entrance pupil position of the luminous flux illuminating the reticle.

Since the position of the optical integrator 107 is approximately the entrance pupil of the luminous flux illuminating the reticle 111, providing the pinhole 201 causes non-uniform distribution of the luminous flux illuminating the reticle 111 within the surface of the entrance pupil, thus influencing a resolution performance. In view of this, the diameter of the pinhole is preferably provided as small as possible, more specifically, about 1% or less of the size of the area where light from the integrator is irradiated.

On the reflection surface of the reflection-type integrator 107, a large number of unit shapes, e.g., very small spherical or cylindrical surfaces, are arranged. EUV light reflected by each of the unit shapes irradiates the entire surface of the reticle illumination area. If, for instance, a pinhole is provided in such a manner as to lack a half of this unit shape, the illumination intensity declines in the half of the reticle illumination area, causing a non-uniform illumination distribution. Therefore, it is preferable to provide a pinhole without lacking the unit shape.

Figure 3:
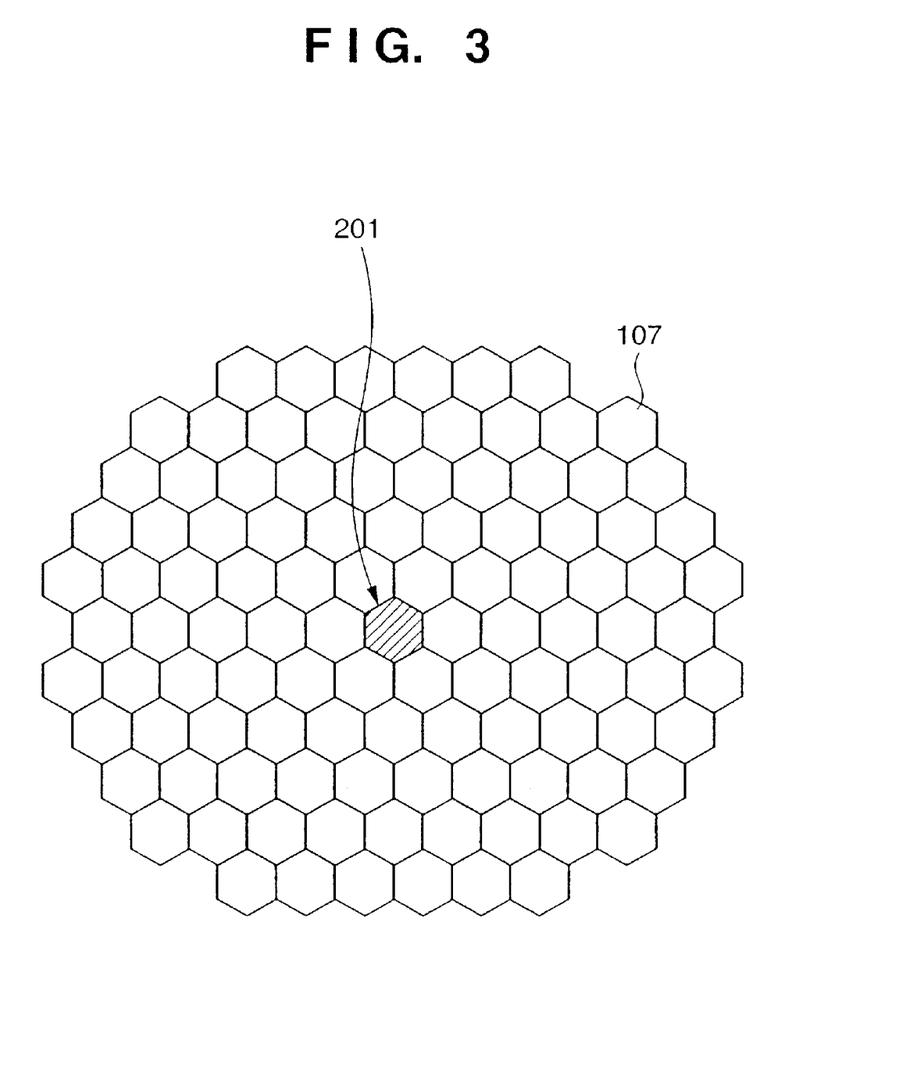
FIG. 3 is a view describing formation of a pinhole in the reflection-type optical integrator according to the first embodiment.
Figure 4:
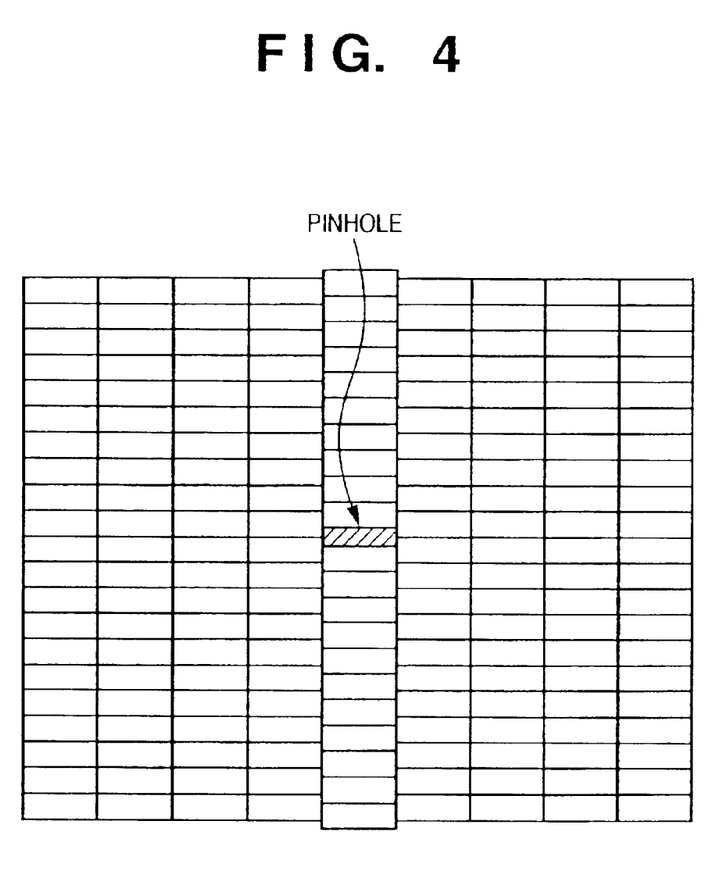
FIG. 4 is a view describing formation of a pinhole in the reflection-type optical integrator according to the first embodiment.

As a method of providing a pinhole without lacking the unit shape, the pinhole is provided so as to remove one whole unit shape as shown in FIG. 3. Alternatively, the arrangement of the unit shapes is shifted to make a clearance as shown in FIG. 4, and a pinhole may be provided on the clearance. If the foregoing methods are used, providing a pinhole does not influence the illumination distribution of EUV light on the reticle.

Furthermore, a shape of the cross section of the pinhole is preferably made askew to match the angle of EUV light incident on the integrator, or made in an "inverse tapered shape," having a small opening on the reflection surface and a large opening on the back surface as shown in FIG. 2, so that the EUV light is not intercepted by the inner surface of the pinhole.

According to the EUV exposure apparatus of the first embodiment having the above-described configuration, an intensity of EUV light is measured at the entrance pupil position of luminous flux illuminating a reticle, and based on the measurement result, the controller 151 controls the amount of exposure in such a manner that the amount of EUV light irradiated to the resist is constant. For instance, in a case where an intensity of EUV light measured fluctuates, methods such as changing a light-emitting intensity of a light source, or changing a light-emitting timing of the light source to alter an average light intensity, or changing an exposure time for a point of a wafer, can be employed. For instance, since the light source emits pulsed light, changing the recurrence frequency of pulse trains can alter an average light intensity. In a case of a laser plasma light source, the recurrence frequency of pulse trains can be altered by changing light-emitting intervals of the laser. If the amount of light is excessive, the amount of light can be reduced by suppressing some of the pulsed light emission of the periodical pulsed light emissions.

Moreover, the controller 151 detects wear in the parts constituting the plasma light source or damage of the illumination system mirrors based on the measured EUV intensity value, and determines the time for exchanging the parts. This is performed, for instance, as follows. The plasma light source emits pulsed light, and the light-emitting intensity for each pulse has variations to a certain degree. Therefore, an average intensity of a large number of pulses is obtained, and a time-varying change of the average intensity is recorded. When the value of the average intensity declines from an initial value by a predetermined amount, e.g., 10% of the initial value, it is determined that parts constituting the plasma light source are worn or the illumination system mirror is damaged, and notification is made to exchange the parts.

As described above, according to the EUV exposure apparatus of the first embodiment, an intensity of EUV light is measured at the entrance pupil position of luminous flux illuminating a reticle, and based on the measurement result, the amount of exposure is controlled in such a manner that the amount of EUV light irradiated to the resist is constant. Accordingly, stable microcircuit pattern transferring operation can be performed without causing fluctuations of the EUV light-emitting intensity, which result in variations in the size of the microcircuit pattern or reduced resolution. Moreover, since wear in the parts constituting the plasma light source and damage of the illumination system mirrors are detected, the time for exchanging the parts can be determined with precision.

Furthermore, at the front of the EUV-light intensity detector 202, the filter 203 formed with a thin-film metal and/or the above-described filter formed with a material including elements that constitute a light element layer forming the multilayer films of the mirror are arranged. By virtue of this, damage on the detector such as lowered sensitivity can be avoided, while preventing deterioration in precision due to visible light or stray light. For instance, the aforementioned filter formed with a material, e.g., monocrystal silicon, nitriding silicon, silicon carbide or the like, transmits visible light. In view of this, a metal filter is overlaid to cut off the visible light. These filters may be of independent filters, or an integrated filter in which a thin-film metal is deposited on a silicon-included filter. When the metal filter is thin, the integrated filter is more advantageous in terms of the ease of production and ease of use.

Furthermore, by virtue of adopting the construction such that the EUV-light intensity detector 202 is arranged away from the pinhole 201 by a predetermined distance, the EUV-light intensity per unit area on the photoreceptive surface of the detector 202 reduces, and damage such as lowered sensitivity of the detector 202 can be prevented.

<Second Embodiment>

In the first embodiment, a pinhole is provided on the optical integrator to measure an intensity of EUV light at the entrance pupil position of luminous flux illuminating a reticle. According to the second embodiment, a reflection mirror is provided on the front surface of the optical integrator to measure an intensity of EUV light at the entrance pupil position of luminous flux illuminating a reticle. Note in the following second embodiment, an EUV exposure apparatus employing a laser plasma light source as similar to the first embodiment will be described. Needless to say, the second embodiment is also applicable to an EUV exposure apparatus employing an electric discharge plasma light source.

Figure 5:
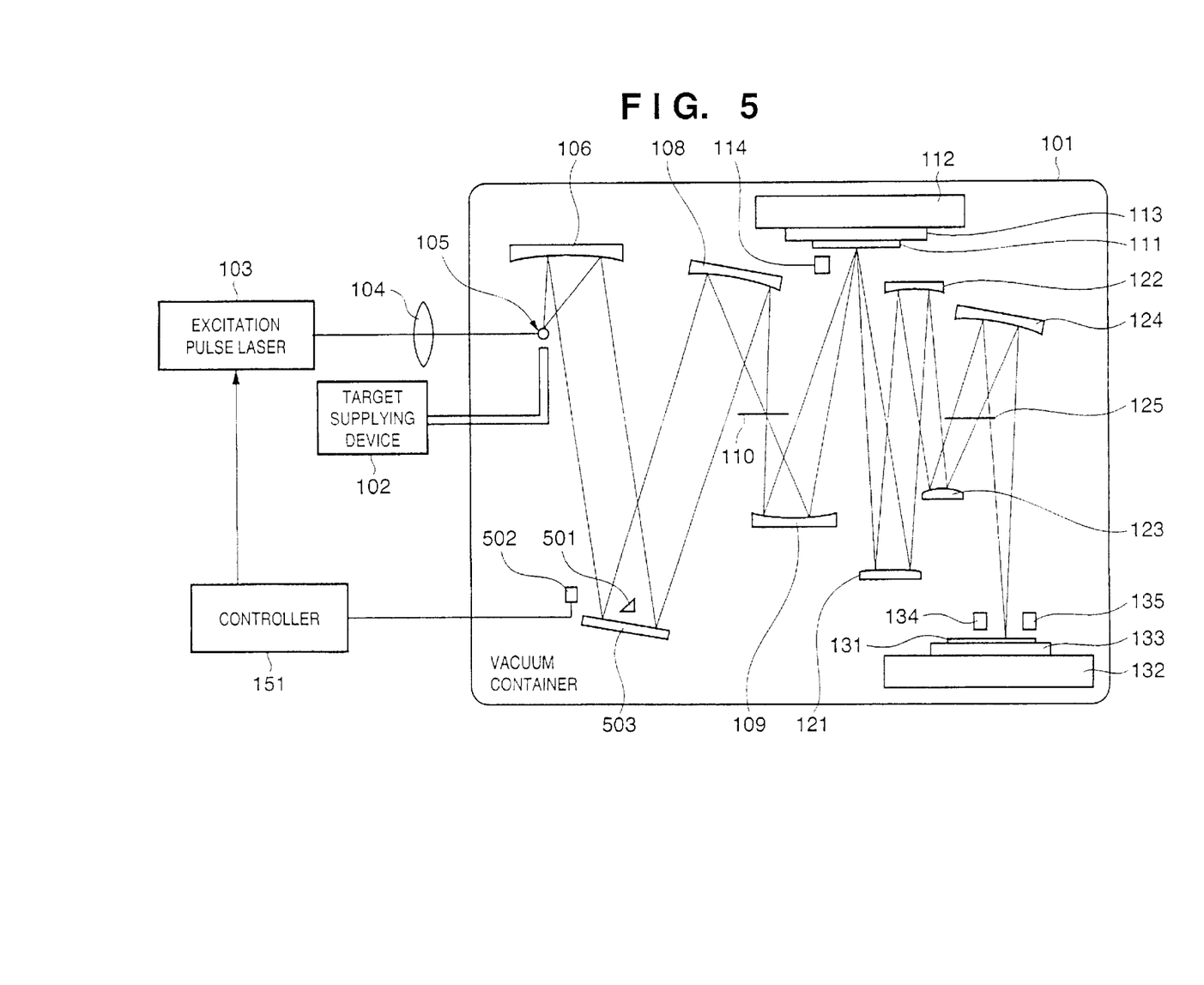
FIG. 5 is a view showing a brief construction of an EUV-light exposure apparatus according to the second embodiment.

FIG. 5 is a view showing a brief construction of an EUV-light exposure apparatus according to the second embodiment. For those configurations similar to the first embodiment (FIG. 1), the same reference numerals are assigned. The construction differs from that of the first embodiment in that a pinhole does not exist in an optical integrator 503, and that a micro-mirror 501 is provided on the front surface of the integrator 503. An intensity of EUV light reflected by the micro-mirror 501 is detected by an EUV-light intensity detector 502. Note that the EUV-light intensity detector 502 has the same function as the EUV-light intensity detector 202. Further, the filter construction similar to that of the first embodiment may be employed.

Figure 6:
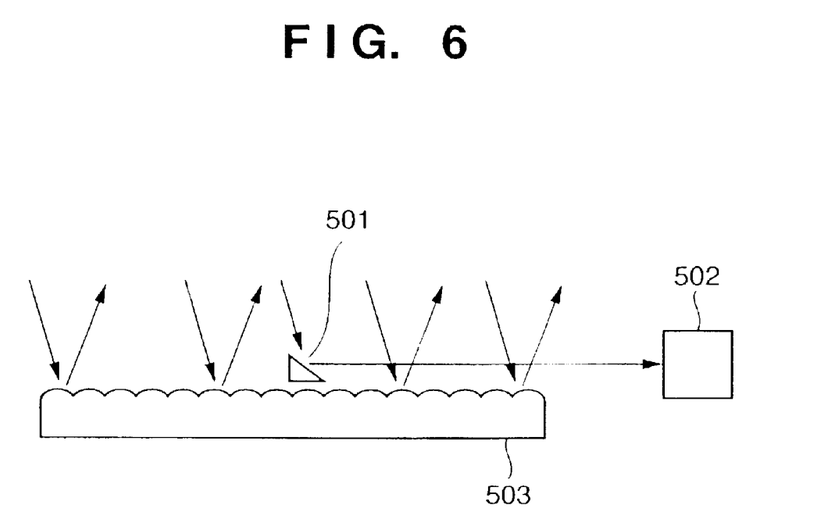
FIG. 6 is an explanatory view showing constructions of a reflection-type optical integrator and its peripherals according to the second embodiment.

In the foregoing configuration, EUV light irradiated by the plasma light source 105 is collected by the illumination system first mirror 106 and directed to the reflection-type optical integrator 503. In the second embodiment, as will be described in detail in FIG. 6, the micro-mirror 501 is provided on the front surface of the reflection-type optical integrator 503. Reflection light from the micro-mirror 501 is directed to a position that does not interrupt the EUV light incident on or outgoing from the optical integrator 503. At this position, the EUV-light intensity detector 502 is provided to detect an intensity of reflection light from the micro-mirror.

As similar to other mirrors in the illumination system and projection system, the micro-mirror 501 is formed by depositing multilayer films on the surface of a substrate consisting of polished glass, metal, ceramics or the like, to achieve a high reflectivity. In a case where the mirror is used in oblique incidence at an incident angle of 60 degrees or more, total reflection may be used, a mirror formed by depositing a platinum or gold single-layer film on a polished silicon carbide or a polished glass substrate may be used.

The micro-mirror 501 may be adhered and fixed to the reflection-type optical integrator, or the reflection-type optical integrator may be punctured to support the micro-mirror from the back surface of the optical integrator through a supporting mechanism.

In addition, micro-mirror 501 may be arranged in a place where incident light to the optical integrator crosses to the reflected light from the optical integrator.

EUV light incident on a point of the optical integrator has a predetermined divergence angle. In a case where the micro-mirror 501 has a flat surface, EUV light reflected by the micro-mirror 501 diverges at the same angle. Since the detector 502 needs to be placed on the position that does not interrupt the EUV light incident on or outgoing from the optical integrator 503, the detector 502 needs to be located away from the micro-mirror 501 by a predetermined distance. Because of this, the size of the reflection light spot may sometimes exceed the size of the photoreceptive surface of the detector 502. In this case, it is preferable that the micro-mirror 501 has a concave surface, e.g., spherical surface, cylindrical surface, spheroidal surface, toroidal surface or the like, so as to keep the divergence angle of the reflected EUV light relatively small. Particularly, by providing the size of the area on the detector 502, where EUV light is irradiated, as large as possible within the size of the photoreceptive surface of the detector 502, the EUV-light intensity per unit area on the photoreceptive surface of the detector 502 can be reduced, and damage such as lowered sensitivity of the detector 502 can be prevented.

By virtue of having the foregoing configuration, an intensity of EUV light can be measured approximately at the entrance pupil position of the luminous flux illuminating the reticle, as similar to the first embodiment.

Note, on the reflection surface of the reflection-type integrator 503, a large number of unit shapes, e.g., very small spherical or cylindrical surfaces, are arranged. EUV light reflected by each of the unit shapes irradiates the entire surface of the reticle illumination area. If, for instance, a micro-mirror is provided in such a manner as to lack a half of this unit shape, the illumination intensity declines in the half of the reticle illumination area, causing a non-uniform illumination distribution. Therefore, it is preferable to provide a micro-mirror without lacking the unit shape.

Figure 7:
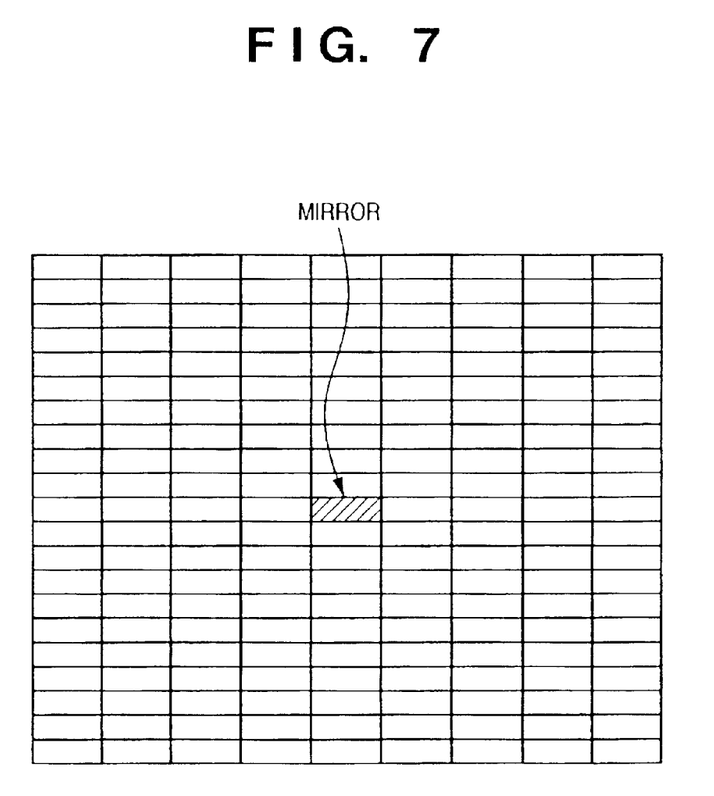
FIG. 7 is view describing a form and arrangement of a micro-mirror in the reflection-type optical integrator according to the second embodiment.

As a method of providing a micro-mirror without lacking the unit shape, a mirror having the shape that covers the entire unit shape is employed. For instance, in a case where the unit shape is a rectangle as shown in FIG. 7, a rectangle micro-mirror that covers the entire unit shape is arranged. If the foregoing method is used, providing a micro-mirror does not influence the illumination distribution of EUV light on the reticle.

According to the second embodiment, an intensity of EUV light is measured at the entrance pupil position of luminous flux illuminating a reticle, and based on the measurement result, the amount of exposure is controlled in such a manner that the amount of EUV light irradiated to the resist is constant, as similar to the first embodiment. Furthermore, based on the measured EUV intensity value, wear in the parts constituting the plasma light source and damage of the illumination system mirrors are detected, and the time for exchanging the parts is determined.

Since the EUV exposure apparatus of the second embodiment measures an intensity of EUV light at the entrance pupil position of luminous flux illuminating a reticle, and controls the amount of exposure based on the measurement result in such a manner that the amount of EUV light irradiated to the resist is constant, an exposure apparatus and exposure method employing EUV light, capable of performing stable microcircuit pattern transferring operation, can be realized without causing fluctuations of the EUV light-emitting intensity, which result in variations in the size of the microcircuit pattern or reduced resolution.

Moreover, since wear in the parts constituting the plasma light source and damage of the illumination system mirrors are detected, the time for exchanging the parts can be determined with precision.

Furthermore, by virtue of the concave surface of the micro-mirror 501, the divergence angle of EUV light reflected by the micro-mirror is kept relatively small. By providing the size of the area on the detector 502, where EUV light is irradiated, as large as possible within the size of the photoreceptive surface of the detector, thereby reducing the EUV-light intensity per unit on the photoreceptive surface of the detector, damage such as lowered sensitivity of the detector can be prevented.

<Third Embodiment>

Figure 9:
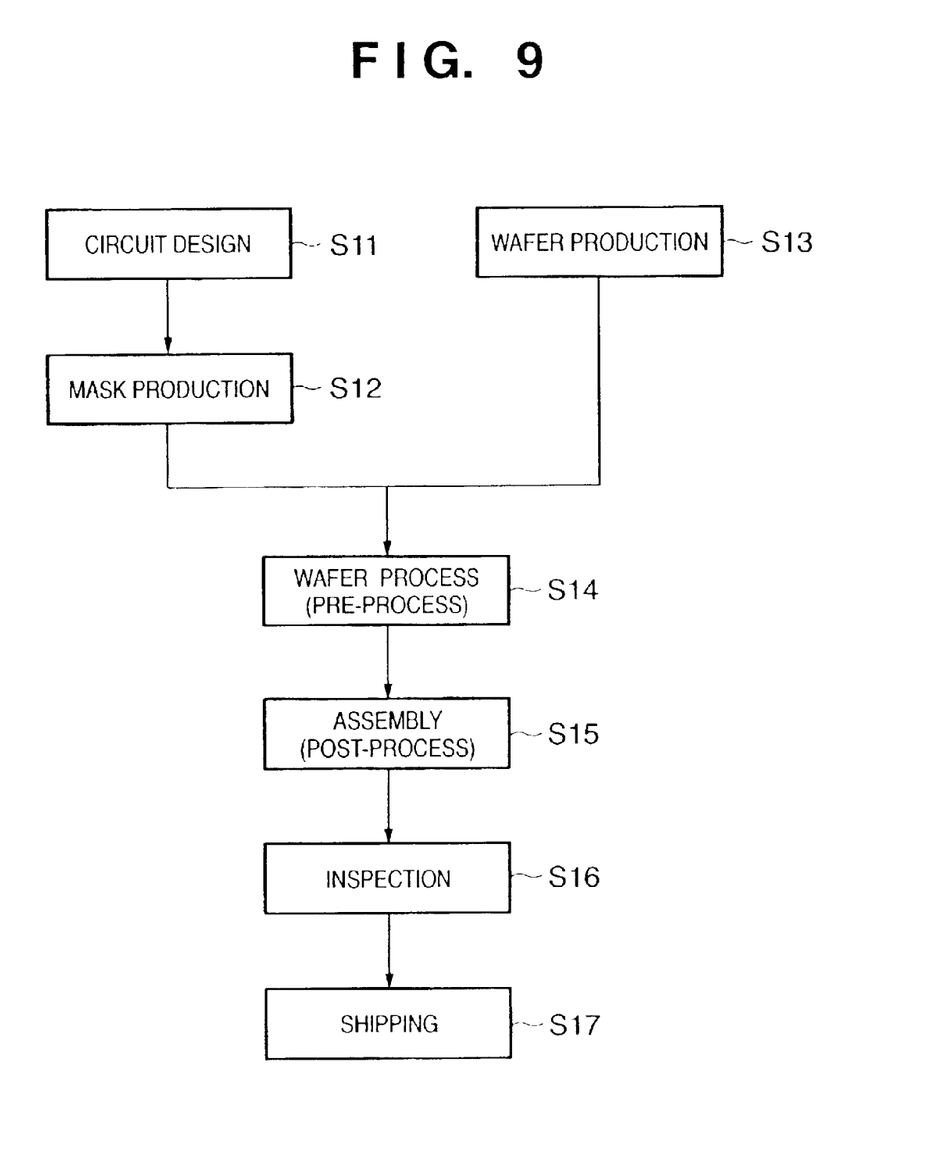
FIG. 9 is a view showing a production flow of a semiconductor device.

Described next is an embodiment of a device manufacturing method employing the above-described exposure apparatus. FIG. 9 shows a production flow of micro devices (semiconductor chips, such as IC or LSI, liquid crystal panels, CCD, thin-film magnetic heads, micro machines, and so forth).

In step S11 (circuit design), a circuit of a semiconductor device is designed. In step S12 (mask production), a mask on which the designed circuit pattern is formed is produced. Meanwhile, in step S13 (wafer production), a wafer is produced with a material such as silicon. In step S14 (wafer process), which is called a pre-process, an actual circuit is formed on the wafer with the use of the mask and wafer by a lithography technique. In step S15 (assembly), which is called a post-process, a semiconductor chip is produced by using the wafer produced in step S14. Step S15 includes assembling process (dicing, bonding), packaging process (chip embedding) and so on. In step S16 (inspection), the semiconductor device manufactured in step S15 is subjected to inspection such as an operation-check test, durability test and so on. Semiconductor devices are manufactured in the foregoing processes and shipped (step S17).

Figure 10:
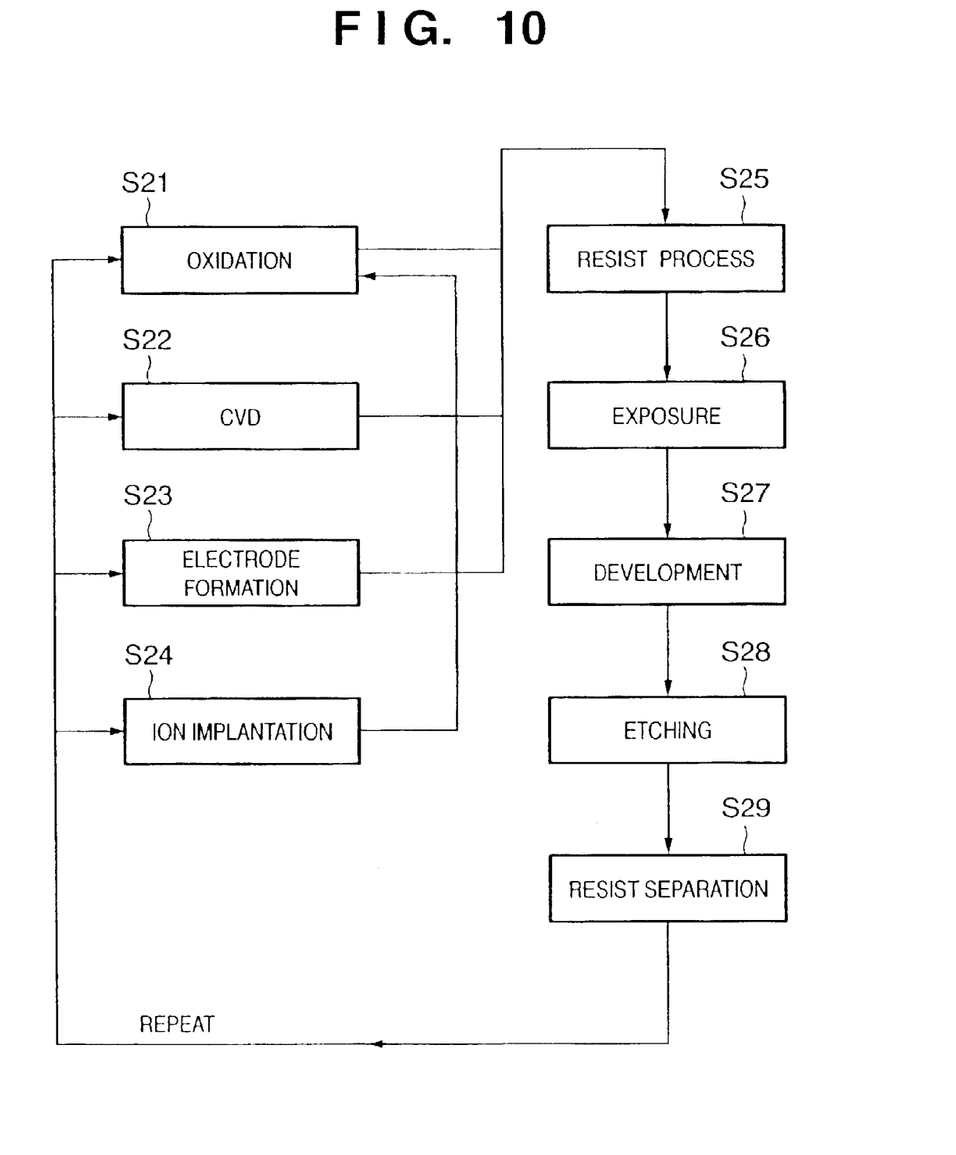
FIG. 10 is a view showing a detailed flow of wafer process.

FIG. 10 shows a flow of the aforementioned wafer process in detail. In step S21 (oxidization), the wafer surface is oxidized. In step S22 (CVD), an insulating film is deposited on the wafer surface. In step S23 (electrode formation), electrodes are deposited on the wafer. In step S24 (ion implantation), ion is implanted on the wafer. In step S25 (resist process), a photosensitive agent is coated on the wafer. In step S26 (exposure), the circuit pattern of the mask is exposed on the wafer by the above-described exposure apparatus. In step S27 (development), the exposed wafer is developed. In step S28 (etching), portions other than the developed resist image are removed. In step S29 (resist separation), unnecessary resist after the etching process is removed. By repeating the foregoing steps, multiple circuit patterns are formed on the wafer.

By virtue of the manufacturing method of the third embodiment, highly integrated semiconductor devices, which have been difficult to produce conventionally, can be produced.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus, including an illumination optical system for directing light from a light source to a reticle and a projection optical system for directing light from the reticle to a substrate, for transferring a pattern on the reticle to the substrate, comprising:
   a reflection-type optical integrator, arranged in the illumination optical system, which is adopted to form a plurality of light source images with the light from the light source;
   branching means adopted to branch a part of the light from the light source at the position of or near said optical integrator; and
   a detector adopted to detect an intensity of light branched by said branching means.

2. The apparatus according to claim 1, further comprising a controller adopted to control an amount of exposure based on the intensity of light detected by said detector.

3. The apparatus according to claim 2, wherein said controller controls an amount of exposure by changing at least one of a light-emitting intensity of the light source, a light-emitting timing of the light source, or a time for exposing a point on the substrate.

4. The apparatus according to claim 1, further comprising notification means adopted to notify necessity to exchange parts of the illumination optical system based on the intensity of light detected by said detector.

5. The apparatus according to claim 1, wherein said branching means includes a pinhole arranged on said optical integrator.

6. The apparatus according to claim 5, wherein said pinhole has the same shape and size as one of a plurality of unit shapes that constitute said optical integrator.

7. The apparatus according to claim 6, wherein said pinhole is arranged at a position corresponding to one of the plurality of unit shapes that constitute said optical integrator.

8. The apparatus according to claim 1, wherein said branching means includes a mirror arranged near a reflection surface of said optical integrator.

9. The apparatus according to claim 8, wherein said mirror is arranged at a position corresponding to one of the plurality of unit shapes that constitute said optical integrator, and has the same shape and size as the unit shape.

10. The apparatus according to claim 8, wherein said illumination optical system includes a first mirror system which leads light from said light source to said optical integrator, and said mirror is arranged in a light path between said first mirror system and said optical integrator.

11. The apparatus according to claim 8, wherein said illumination optical system includes a second mirror system which leads light from said optical integrator to said reticle, and said mirror is arranged in a light path between said second mirror system and said optical integrator.

12. The apparatus according to claim 8, wherein said mirror is arranged in a place where incident light to said optical integrator crosses to reflected light from said optical integrator.

13. The apparatus according to claim 1, wherein a filter is provided between said detector and said branching means to remove visible light or to reduce an intensity of light branched by said branching means.

14. The apparatus according to claim 1, wherein said light source is an EUV light source.

15. A control method of an exposure apparatus, which includes an illumination optical system for directing light from a light source to a reticle and a projection optical system for directing light from the reticle to a substrate, for transferring a pattern on the reticle to the substrate, said method comprising:
   a detection step of detecting an intensity of light branched by branching means, which is provided to branch a part of the light from the light source at the position of or near a reflection-type optical integrator, that is arranged in the illumination optical system for forming a plurality of light source images with the light from the light source; and
   a control step of controlling an amount of exposure based on the intensity of light detected in said detection step.

16. The method according to claim 15, wherein in said control step, an amount of exposure is controlled by changing at least one of a light-emitting intensity of the light source, a light-emitting timing of the light source, or a time for exposing a point on the substrate.

17. The method according to claim 15, further comprising a notification step of notifying necessity to exchange parts of the illumination optical system based on the intensity of light detected in said detection step.

18. The method according to claim 15, wherein the light source is an EUV light source.

19. A device manufacturing method, comprising a step of exposing a substrate by employing the exposure apparatus described in claim 1, and a step of developing the exposed substrate.

* * * * *

UNITED STATES PATENT AND TRADEMARK OFFICE
CERTIFICATE OF CORRECTION

PATENT NO. : 6,825,481 B2
DATED : November 30, 2004
INVENTOR(S) : Akira Miyake

It is certified that error appears in the above-identified patent and that said Letters Patent is hereby corrected as shown below:

Column 1,
Line 25, "KrE" should read -- KrF --.

Column 3,
Line 62, "is deteriorated." should read -- deteriorates. --.

Column 4,
Line 3, "unevenness" should read -- uneven --.
Line 4, "at" should read -- in the --.

Column 7,
Line 24, "attaches" should read -- attach --.

Signed and Sealed this

Twenty-sixth Day of April, 2005

JON W. DUDAS
*Director of the United States Patent and Trademark Office*